(12) United States Patent
LaGrotta et al.

(10) Patent No.: US 6,201,221 B1
(45) Date of Patent: Mar. 13, 2001

(54) METHOD AND APPARATUS FOR HEAT REGULATING ELECTRONICS PRODUCTS

(75) Inventors: James T. LaGrotta, Boonton Township; Richard T. LaGrotta, Livingston, both of NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/397,031

(22) Filed: Sep. 16, 1999

(51) Int. Cl.$^7$ ........................................ H05B 1/02
(52) U.S. Cl. .................. 219/483; 219/121.43; 219/494; 219/209; 361/698; 361/704
(58) Field of Search ................... 219/483–486, 219/121.4, 121.43, 494, 209, 497, 210; 118/724, 725; 438/715; 156/345; 361/698, 699, 709, 724, 704

(56) References Cited

U.S. PATENT DOCUMENTS

| | | |
|---|---|---|
| 5,390,076 * | 2/1995 | Umezawa ............................. 361/689 |
| 5,402,311 | 3/1995 | Nakajima . |
| 5,794,454 | 8/1998 | Harris et al. . |
| 5,892,207 * | 4/1999 | Kawamura et al. ................. 219/492 |
| 5,898,573 | 4/1999 | Fugaro . |

* cited by examiner

*Primary Examiner*—Mark Paschall
(74) *Attorney, Agent, or Firm*—Dickstein Shapiro Morin & Oshinsky LLP

(57) ABSTRACT

A heating/cooling apparatus for electronic components of a wireless base station is described. The apparatus includes a heat exchanger having a material-filled chamber and a plurality of extrusions. The chamber is located adjacent to the electronic components. A heater is provided within the chamber. The material within the chamber, which is preferably a liquid, serves to conduct heat from the electronic components to the extrusions. The heater serves to heat the material within the chamber, which in turn conducts that heat to the electronic components, when heat is required to maintain operation of the components with prescribed parameters.

35 Claims, 2 Drawing Sheets

METHOD AND APPARATUS FOR HEAT REGULATING ELECTRONICS PRODUCTS

FIELD OF THE INVENTION

The present invention relates generally to electronics products, and more particularly to an apparatus and a method for providing a heat transfer conduit for the electronic components that operate over a wide temperature range.

BACKGROUND OF THE INVENTION

Wireless electronics products are used in a variety of applications under a number of varying environmental conditions. Wireless products, for example, cellular products, embedded in wireless base stations must be able to function optimally within a broad temperature range. Specifically, wireless base stations are positioned in and operate in environments with a range of temperature from about minus forty degrees Celsius (−40° C.) to about fifty-two degrees Celsius (52° C.).

Current efforts to provide sufficient heating and cooling regimes to wireless base stations have several deficiencies. One effort includes the use of conduction cooling through a heat sink. However, since wireless base stations may, due to their geographical positioning, operate anywhere within the large environmental temperature range (−40° C. to 52° C.), designing a heat sink for optimal performance over that temperature range is difficult. Particularly, a heat sink designed to operate optimally at higher temperatures typically will not operate optimally at lower temperatures. Heaters have also often been added to the conduction cooling devices for heating wireless base station components in lower environmental temperatures. However, in most applications there is insufficient room for an adequately sized heater capable of heating the base station electronic components to a desired temperature range.

An additional problem encountered with conventional approaches is that some electronic components have very high power densities which create localized high heat densities which are often not well dissipated by current approaches.

There exists a need for a heating and cooling apparatus which operates optimally across a broad environmental temperature range, which fits conveniently within wireless base stations in proximity to the electronic components, and which adequately dissipates the high heat densities caused by the heat generated by the electronic components and which adequately heats the electronic components when necessary to maintain desired operating parameters.

SUMMARY OF THE INVENTION

The present invention provides a temperature regulating apparatus for broadening an operating temperature range for electronic components. The temperature regulating apparatus includes a chamber containing a heat transferring material, a plurality of extrusions for providing convection cooling to the chamber and electronic components coupled to the chamber, and a heater located in the chamber for heating, as necessary, the heat transferring material and, in turn, the electronic components. The chamber is located adjacent to the electronic components.

The present invention also provides a wireless base station having electronic components which give off heat when in operation, or which are provided in cold operating environments and need heat to properly operate, which are coupled to the above-described temperature regulating apparatus.

The present invention also provides a method for broadening an operating temperature range for electronic components used in a wireless base station. The method includes the steps of conducting heat from the electronic components to a material-filled chamber with a heat exchanger, cooling the electronic components and the chamber through convection cooling, and heating the chamber, when necessary, with the heater. The convection cooling is accomplished through a plurality of extruded fins extending off of the chamber.

These and other features and advantages of the invention will be more clearly understood from the following detailed description of the invention which is provided in connection with the accompanying drawings.

DETAILED DESCRIPTION OF THE PREFERRED EMBODIMENTS

The invention will be described and illustrated below with particular reference to its use with electronics products incorporated within wireless base stations. However, the invention is not limited to use with electronics products incorporated within wireless base stations and may be used with any electronics products which operate over a large temperature range.

Figure 1:
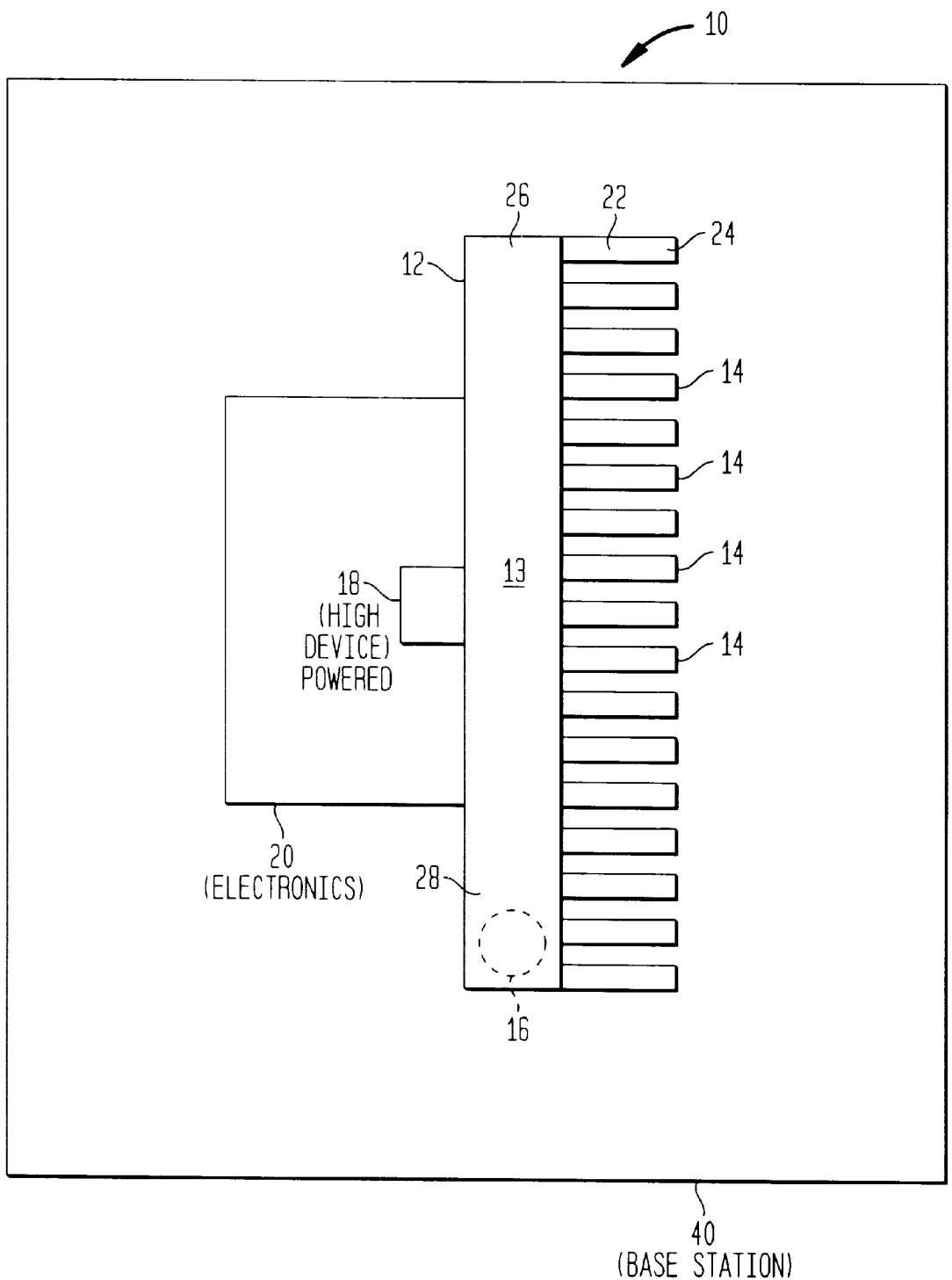
FIG. 1 is a schematic view of a temperature regulating apparatus constructed in accordance with an embodiment of the invention.
Figure 2:
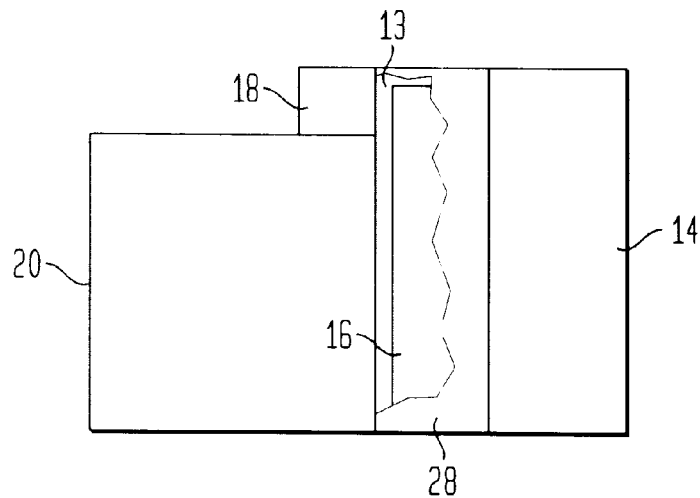
FIG. 2 is a side view of the temperature regulating apparatus of FIG. 1.
Figure 3:
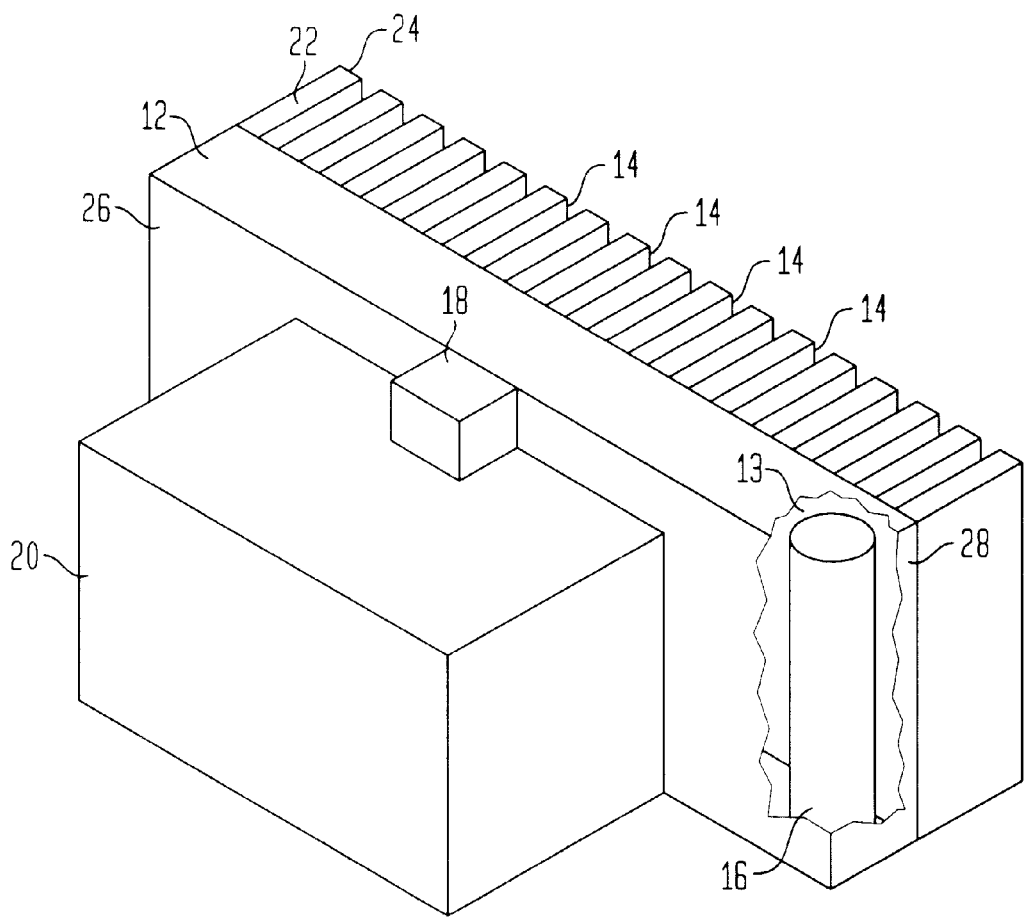
FIG. 3 is a perspective view of the temperature regulating apparatus of FIG. 1.

A temperature regulating apparatus 10 is shown in FIG. 1. The apparatus 10 includes a material-filled chamber 12 and a plurality of extrusions, or fins, 14. Embedded within the chamber 12 at an end 28 is a heater 16. The chamber 12 abuts a high power device 18 and/or other heat generating electronic components 20 within a base station 40. The chamber 12 is aligned with the electronic components 20 and device 18 such that they abut the chamber 12 at a position between opposing ends 28 and 26. The high power device 18 and/or other electronic components 20 may be provided, for example, at a wireless base station, though the invention can be used wherever electronic components need to be heated and/or cooled.

Each fin 14 is attached to the chamber 12 at an end 22. The fins 14 further have an opposite end 24 extending outwardly from the chamber 12. As illustrated, the fins 14 extend generally parallel to each other from the chamber 12 in a linear array. It is to be understood, however, that the fins 14 may extend from the chamber 12 at an angle to each other, or in any other arrangement which provides good heat dispersion properties.

The chamber 12 is filled with a heat transferring material 13 which serves to receive heat from and provide cooling to the device 18 and/or other electronic components 20. The material 13 is preferably a liquid, such as, for example, freon, water, glycol, alcohol, or a mixture of these and/or other suitable heat transferring liquids.

The material 13 within the chamber 12 serves to transfer heat to and from the device 18 and/or the other electronic components 20 and from and to the fins 14. That That is, heat generated by the device 18 and/or the other electronic components 20 is conducted to the chamber 12, where the material 13 serves as a heat exchanger. The heat conducted to the material 13 is further transferred to fins 14, and finally is dissipated to the atmosphere. The high heat density which may be caused by the device 18 and/or the other electronic components 20 is lessened due to the conduction of the heat through the material 13 to the fins 14. If the material 13 is a liquid, boiling of the liquid will occur at the site of the high power dissipation. The boiling will lead to a higher heat transfer rate throughout the liquid 13 and to the fins 14, causing a more uniform heating spread and lowering of the temperature of the device 18 and/or other electronic components 20.

At lower temperatures, where a cold environment may adversely affect the performance of the device 18 and/or other electronic components 20, the heater 16 is activated at a predetermined environmental temperature level and the heat from the heater 16 is conducted through the material 13 to the device 18 and/or electronic components 20. Placement of the heater 16 within the chamber 12 alleviates the problem of sufficient space being available for the heater 16. Further, the heater 16 provides a uniform heat source through the material 13 allowing for a heating/cooling device which can be used over wide environmental temperature variations. The apparatus 10 allows the device 18 and/or the electronic components 20 to operate optimally within the normal environmental range experienced by wireless base stations, namely from about minus forty degrees Celsius (−40° C.) to about fifty-two degrees Celsius (52° C.).

The present invention provides an apparatus and a method for dissipating a high heat density caused by electronic components and devices of wireless base stations and for heating such components and devices when necessary. The present invention further provides an apparatus and method which enables such components and devices to operate over a broad environmental temperature range.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, although the invention is illustrated as including a rectangular chamber 12 with fins 14 extending therefrom, it is to be understood that any suitably configured chamber may be utilized, including one having curved or angled shapes, depending on the arrangement and nature of the components and/or devices to be cooled or heated. Further, although the chamber 12 is shown adjacent to one side of the electronic components 20 and high powered device 18, the chamber 12 may instead wrap around one or more sides of the components and/or devices. Accordingly, the invention is not to be seen as limited by the foregoing description, but is only limited by the scope of the appended claims.

What is claimed as new and desired to be protected by Letters Patent of the United States is:

1. A temperature regulating apparatus comprising:
    a chamber containing a heat transferring material, said chamber having a portion thereof which is adapted to be located adjacent to an object for heat exchange therewith;
    a plurality of heat dissipating elements connected to said chamber for providing convection cooling to said chamber; and
    a heater located in said chamber for selectively heating said heat transferring material under predetermined conditions.

2. The apparatus of claim 1, wherein the heat transferring material comprises a liquid.

3. The apparatus of claim 2, wherein said liquid comprises glycol.

4. The apparatus of claim 2, wherein said liquid comprises alcohol.

5. The apparatus of claim 2, wherein said liquid comprises water.

6. The apparatus of claim 2, wherein said liquid comprises freon.

7. The apparatus of claim 1, wherein said heat dissipating elements are fins located along a side of said chamber.

8. The apparatus of claim 7, wherein said fins are arranged in a linear array.

9. The apparatus of claim 7, wherein said fins are located along a side of said chamber which is opposite from a side of said chamber having said portion adapted to be located adjacent to an object.

10. The apparatus of claim 1, wherein said apparatus is capable of operating in an environmental temperature range from about −40° C. to about 52° C.

11. The apparatus of claim 1, wherein said portion of said chamber comprises a side of said chamber.

12. The apparatus of claim 11, wherein said portion of said chamber comprises a flat side of said chamber.

13. A temperature regulating apparatus comprising:
    a chamber containing a heat transferring liquid, said chamber having a portion thereof which is adapted to be coupled to an object for heat exchange therewith;
    a plurality of fins located along a side of said chamber, said fins providing convection cooling to said chamber; and
    a heater located in said chamber for selectively heating said heat transferring liquid under predetermined conditions.

14. The heat exchanger of claim 13, wherein the heat exchanger is capable of operating in an environmental temperature range of from about −40° C. to about 52° C.

15. The heat exchanger of claim 14, wherein said fins are located along a side of said chamber which is opposite from a side of said chamber having said portion which is adapted to be coupled to an object.

16. The heat exchanger of claim 13, wherein said liquid comprises glycol.

17. The heat exchanger of claim 13, wherein said liquid comprises alcohol.

18. The heat exchanger of claim 13, wherein said liquid comprises water.

19. The heat exchanger of claim 13, wherein said liquid comprises freon.

20. A wireless base station, comprising:
    electronic components which require heating and/or cooling to maintain operation within a predetermined operating range; and
    a heat exchanger comprising:
    a chamber containing a heat transferring material, said chamber located adjacent said electronic components;
    a plurality of heat dispersing elements for providing convection cooling to said
    chamber and said electronic components; and
    a heater located in said chamber.

21. The wireless base station of claim 20, wherein the heat transferring material comprises a liquid.

22. The wireless base station of claim 21, wherein said liquid comprises glycol.

23. The wireless base station of claim 21, wherein said liquid comprises alcohol.

24. The wireless base station of claim 21, wherein said liquid comprises water.

25. The wireless base station of claim 21, wherein said liquid comprises freon.

26. The wireless base station of claim 20, wherein said elements comprise fins located along a side of said chamber.

27. The wireless base station of claim 26, wherein said fins are located along a side which is opposite from a side of said chamber adjacent to the electronic components.

28. The wireless base station of claim 20, wherein the heat exchanger is capable of operating in an environmental temperature range of from about −40° C. to about 52° C.

29. A method for adjusting an operating temperature for electronic components in a wireless base station, said method comprising the steps of:

providing a temperature regulating apparatus at a location adjacent said electronic components, said temperature regulating apparatus comprising:

a chamber containing a heat transferring material;

a plurality of heat dispersing elements located along a side of the chamber; and a heater located in the chamber;

cooling the electronic components using the chamber through convection cooling with the heat transferring elements; and heating the chamber with the heater to provide heat to said components under predetermined conditions.

30. The method of claim 29, wherein said material is a liquid and said temperature regulating apparatus conducts heat through said heat transferring liquid in said chamber.

31. The method of claim 30, wherein the liquid comprises glycol.

32. The method of claim 30, wherein the liquid comprises alcohol.

33. The method of claim 30, wherein the liquid comprises water.

34. The method of claim 30, wherein the liquid comprises freon.

35. The method of claim 29, wherein the steps of heating and cooling with the temperature regulating apparatus enable the electronic components to operate optimally in an environmental temperature range of from about −40° C. to about 52° C.

* * * * *